US009349464B2

(12) United States Patent
Shiga et al.

(10) Patent No.: US 9,349,464 B2
(45) Date of Patent: *May 24, 2016

(54) NON-VOLATILE SEMICONDUCTOR DEVICE

(71) Applicant: KABUSHIKI KAISHA TOSHIBA, Tokyo (JP)

(72) Inventors: Hidehiro Shiga, Kanagawa (JP); Masanobu Shirakawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/607,612

(22) Filed: Jan. 28, 2015

(65) Prior Publication Data
US 2015/0138883 A1 May 21, 2015

Related U.S. Application Data

(63) Continuation of application No. 13/783,363, filed on Mar. 3, 2013, now Pat. No. 8,976,602.

(30) Foreign Application Priority Data

Aug. 13, 2012 (JP) ................. 2012-179445

(51) Int. Cl.
*G11C 16/04* (2006.01)
*G11C 16/14* (2006.01)
*G11C 16/34* (2006.01)
*G11C 16/08* (2006.01)
*H01L 27/115* (2006.01)

(52) U.S. Cl.
CPC ............ *G11C 16/14* (2013.01); *G11C 16/0483* (2013.01); *G11C 16/08* (2013.01); *G11C 16/3436* (2013.01); *G11C 16/3445* (2013.01); *H01L 27/11573* (2013.01); *H01L 27/11582* (2013.01)

(58) Field of Classification Search
CPC .... G11C 16/14; G11C 16/08; G11C 16/0483; G11C 16/3436; G11C 16/3435
USPC .............. 365/185.17, 185.18, 185.23, 185.29
See application file for complete search history.

(56) References Cited

U.S. PATENT DOCUMENTS 7,430,138 B2 9/2008 Higashitani
7,907,449 B2 3/2011 Lee et al.
(Continued)

FOREIGN PATENT DOCUMENTS

JP 2011040142 A 2/2011
JP 2012-119013 A 6/2012

OTHER PUBLICATIONS

Japanese Office Action dated May 12, 2015 in counterpart Japanese Patent Application 2012-179445 with English Translation.

*Primary Examiner* — Gene Auduong
(74) *Attorney, Agent, or Firm* — Patterson & Sheridan, LLP

(57) ABSTRACT

A non-volatile semiconductor device includes first and second selecting transistors; multiple memory cells that are stacked above the substrate; multiple word lines that are connected to control gates of the multiple memory cells; selecting gate lines that are each connected to a gate of one of the selecting transistors; a bit line connected to the first selecting transistor; a source line connected to the second selecting transistor; and a control circuit configured to execute an erasing loop that includes an erase operation and a verifying operation. The control circuit increases an erasing voltage in accordance with the number of times the erasing loop is repeated.

14 Claims, 11 Drawing Sheets

(56) References Cited

U.S. PATENT DOCUMENTS

| | | |
|---|---|---|
| 7,907,463 B2 | 3/2011 | Edahiro et al. |
| 8,315,097 B2 | 11/2012 | Hishida et al. |
| 8,509,001 B2 | 8/2013 | He et al. |
| 8,976,602 B2 * | 3/2015 | Shiga ................. G11C 16/3436 365/185.17 |
| 2010/0172189 A1 | 7/2010 | Itagaki et al. |
| 2010/0238732 A1 | 9/2010 | Hishida et al. |
| 2010/0329017 A1 | 12/2010 | Nakano et al. |
| 2011/0013461 A1 | 1/2011 | Shiino et al. |
| 2011/0216604 A1 | 9/2011 | Mikajiri et al. |
| 2011/0242899 A1 | 10/2011 | Oowada et al. |
| 2012/0257455 A1 * | 10/2012 | Oh ......................... G11C 16/10 365/185.22 |
| 2014/0085982 A1 | 3/2014 | Asaoka et al. |
| 2015/0243634 A1 * | 8/2015 | Aritome .............. H01L 25/0657 257/774 |

* cited by examiner

NON-VOLATILE SEMICONDUCTOR DEVICE

CROSS-REFERENCE TO RELATED APPLICATION

This application is a continuation of U.S. patent application Ser. No. 13/783,363, filed on Mar. 3, 2013, which is based upon and claims the benefit of priority from Japanese Patent Application No. 2012-179445, filed Aug. 13, 2012; the entire contents of each of which are incorporated herein by reference.

FIELD

Embodiments described herein relate to non-volatile semiconductor memory devices.

BACKGROUND

NAND flash memory is well known as one type of non-volatile semiconductor device that can be rewritten electronically. To improve bit density of NAND flash memories, because the miniaturization technology is reaching its limit, lamination of memory cells are being expected.

When erasing data in the conventional flat panel NAND flash memory, a voltage of about 0V is provided to the gate of the memory cell, and an erasing voltage of high voltage is provided to the well where the memory cells are formed. In the case when one erase operation does not decrease the memory cell threshold to a desired value, another erase operation is performed. During this time, the erasing voltage is set to a higher value than the value used in the previous erase operation.

In a laminated (stacked or layered) NAND flash memory, the types of voltages used when erasing data, as compared to the conventional flat panel NAND flash memory, have increased. However, a method to step up the various voltages used when erasing data, as well as a memory device adapted for this method, has not been established.

DETAILED DESCRIPTION

Figure 1:
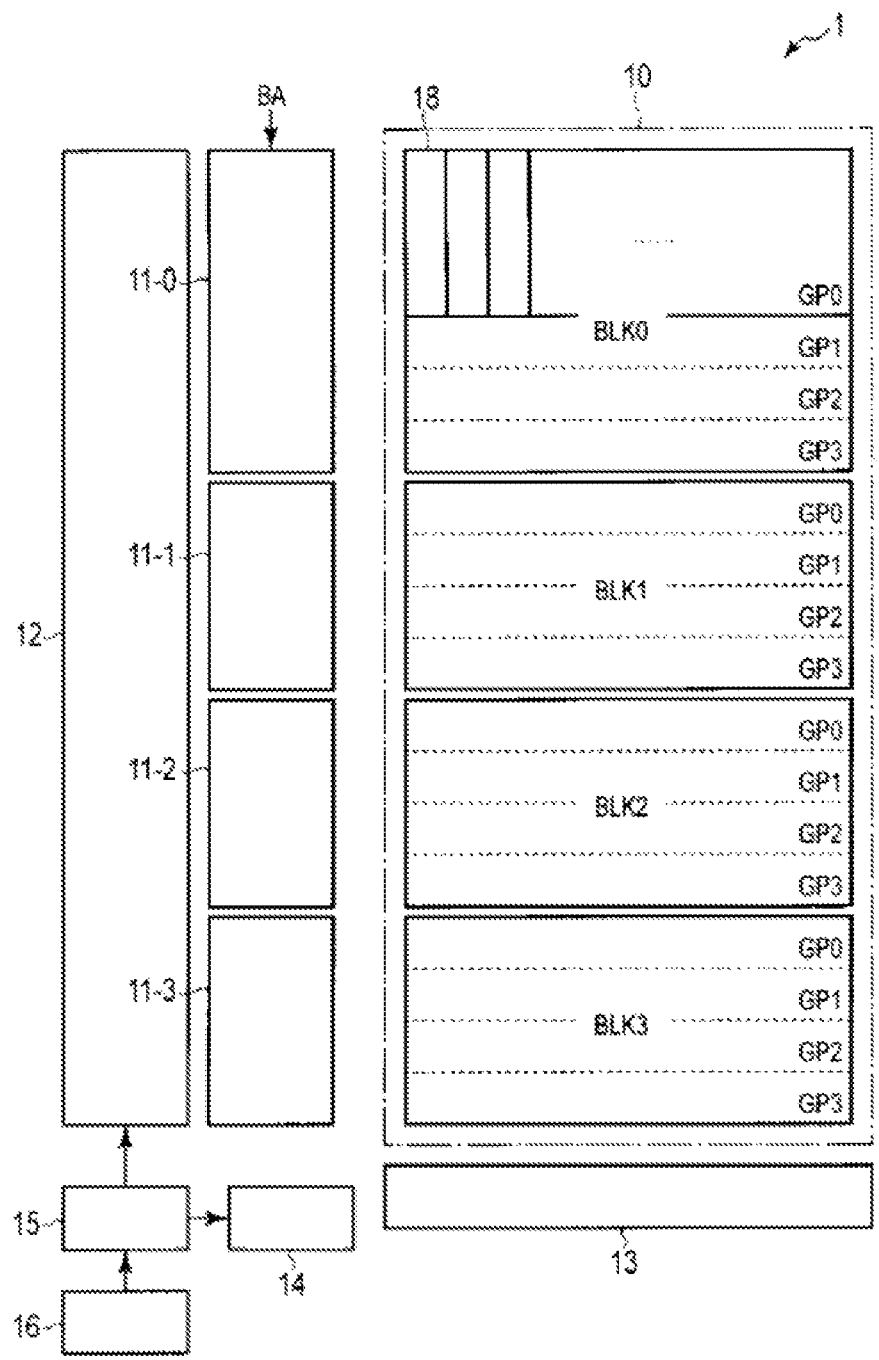
FIG. 1 is a block diagram of NAND flash memory according to a first embodiment.

Embodiments provide a non-volatile semiconductor device that will perform a stable erase operation by adjusting the step up voltage of the various voltages used during the erase operation.

In general, according to one embodiment, it will be explained referring to the drawings provided. The drawings are provided for schematic, conceptual purpose and may not exactly scale with the actual product. The several embodiments presented below are the devices and methods to put the industrial ethics of the present invention into effect, and the industrial ethics of the present invention is not specified by the component configuration, structure, or arrangement. The elements containing identical functions and structures will be added with identical symbols and repetitive explanations will only be added as necessary.

A non-volatile semiconductor device according to an embodiment includes first and second selecting transistors; multiple memory cells that are stacked above the substrate and connected in series between the first and second selecting transistors; multiple word lines connected to control gates of the multiple memory cells; first and second selecting gate lines connected respectively to a gate of the first selecting transistor and a gate of the second selecting transistor; a bit line connected to one end of a current path of the first selecting transistor; a source line connected to one end of a current path of the second selecting transistor; and a control circuit configured to execute an erasing loop which includes an erase operation to erase data in the multiple memory cells, and a verifying operation to verify that the data in the multiple memory cells have been erased. The control circuit is configured to step up (increase) an erasing voltage, a first voltage provided to the bit line or the source line, and a second voltage provided to the first selecting gate line or the second selecting gate line, in accordance with the number of times the erasing loop is repeated; the step up voltage of the erasing voltage, and the first and second voltages are individually adjusted by the control circuit.

Embodiment 1

For the non-volatile semiconductor device below, three-dimensionally laminated NAND flash memories in which multiple memory cells are laminated on the substrate is used as example to explain.

[1] Structure of the Non-Volatile Semiconductor Device

First, the structure of the non-volatile semiconductor device (NAND flash memory) relating to the present embodiment will be explained.

FIG. 1 is the block diagram of the NAND flash memory 1 relating to the Embodiment 1. NAND flash memory 1 contains a memory cell array 10, row decoder 11 (11-0 to 11-3), driver circuit 12, sense amplifier 13, bit line/source line driver (BL/SL driver) 14, voltage generation circuit 15, and control circuit 16.

Memory cell array 10 contains multiple (4 in the present example) blocks BLK (BLK0 to BLK3) each containing multiple non-volatile memory cells. The erase operation is performed per one block BLK. Each block BLK contains multiple (4 in the present example) memory groups GP (GP0 to GP3) where the memory cells are a collection of serially connected NAND strings 18. The amount of blocks BLK within memory cell array 10 and memory groups GP within blocks BLK may be set at one's discretion.

Row decoders 11-0 to 11-3 are arranged so that each are mapped onto blocks BLK0 to BLK3. Each row decoders 11 will select the row direction of the corresponding block BLK. In addition, when writing, reading, and erasing data, row decoder 11 provides various voltages to the word line, selecting gate line, dummy word line, and back gate line that are arranged at a predetermined position on block BLK.

The driver circuit 12 provides row decoder 11 with voltages needed when writing, reading, and erasing data. This voltage is provided to the memory cell by the row decoder 11.

The BL/SL driver 14 provides bit line and source line, which will be mentioned later, with voltages needed when writing, reading, and erasing data. Especially during the erase operation, voltage VERA (erase or erasing voltage) is provided to bit line BL and/or source line SL. Sense amplifier 13 will sense and amplify the data read from the memory cell when reading data, writing data are transferred to the memory cell when writing data.

The voltage generation circuit 15 generates necessary voltage when writing, reading, and erasing data, and provides them to driver circuit 12 and BL/SL driver 14. Especially during the erase operation, voltage generation circuit 15 generates various voltages (voltage VERA, voltage VERA_GIDL, voltage VERA_NOGIDL, voltage VERA_DWL, and voltage VERA_BG) for the erase operation based on the control of the control circuit 16. The various voltages for the erase operation will be mentioned later.

The control circuit 16 controls the entire behavior of NAND flash memory 1. For this control, control circuit 16 provides each circuit of NAND flash memory 1 with various control signals.

[1-1] Structure of the Memory Cell Array 10

Figure 2:
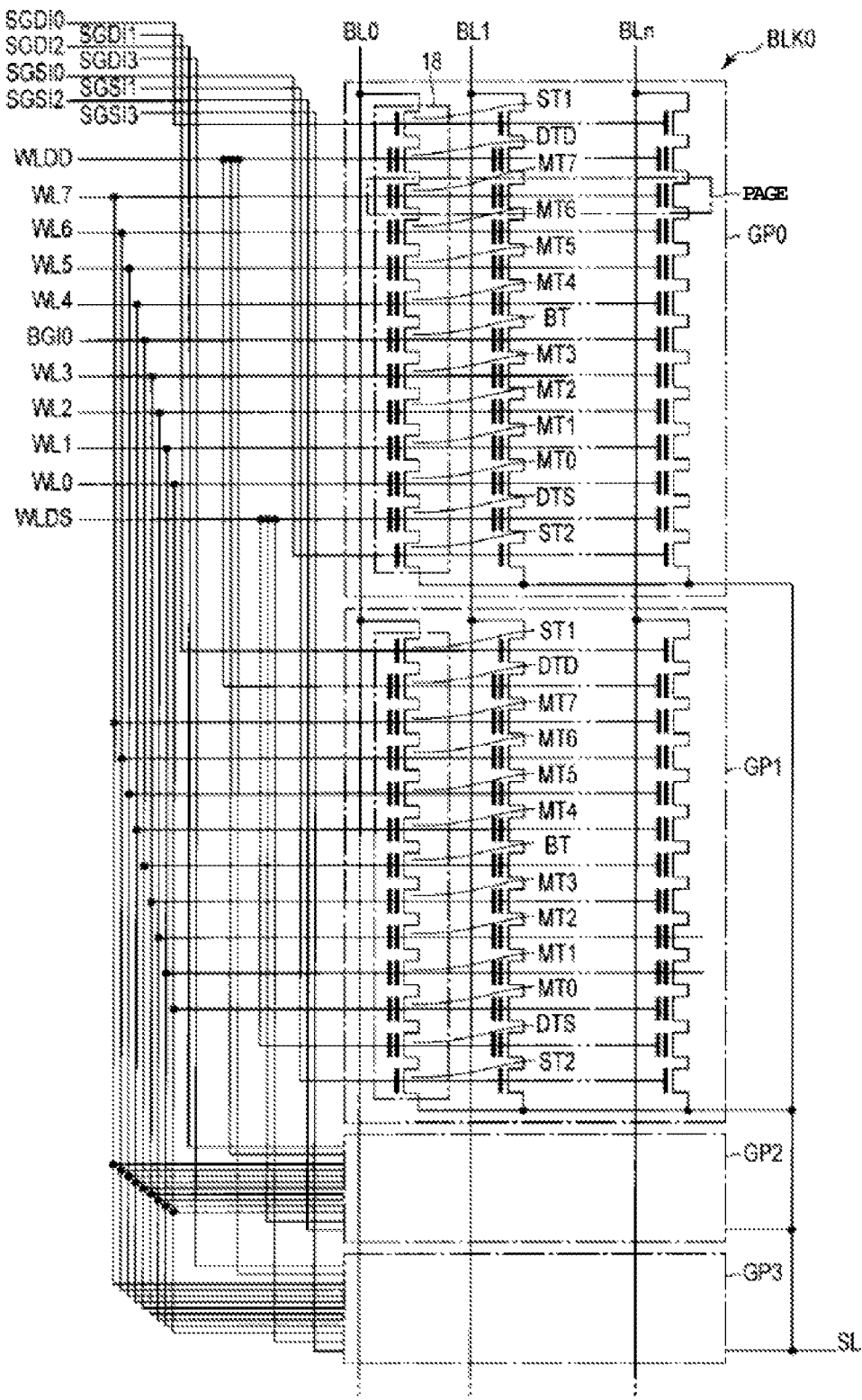
FIG. 2 is a circuit diagram of block (BLK).

Next, the structure of the memory cell array 10 will be explained. FIG. 2 is the circuit diagram of block BLK0. Blocks BLK1 to BLK3 are of similar structure to BLK0 although not shown in FIG. 2.

Block BLK0 possesses 4 memory groups GP0 to GP3. Each memory groups GP possess n (n is a natural number) number of NAND strings 18.

Each of the NAND strings 18 possess for instance, 8 memory cell transistors MT (MT0 to MT7), 2 selecting transistors ST1 and ST2, and a back gate transistor BT. Each memory cell transistor MT possesses a laminated gate that includes a charge storage layer and a control gate, and stores data in a non-volatile manner. The number of memory cell transistors MT is not limited to 8, they may be 16, 32, 64, even 128, the number of memory cell transistors MT may be set at one's discretion. Similar to memory cell transistor MT, the back gate transistor BT also possess a laminated gate that includes a control gate and charge storage layer. The back gate transistor BT is not for storing data, it becomes ON state when writing, reading, and erasing data.

Memory transistor MT and back gate transistor BT is arranged in between selecting transistor ST1 and ST2 so that the current path is connected in series. Back gate transistor BT is placed in between memory cell transistors MT3 and MT4. One end of this series connection, the current path of the memory transistor MT7 is connected to one end of the current path of the selecting transistor ST1; the other end, the current path of the memory transistor MT0 is connected to one end of the current path of the selecting transistor ST2.

In addition, for each NAND string 18 in the present embodiment, dummy transistor DTD is arranged in between selecting transistor ST1 and memory transistor MT7 so that the current paths are serially connected. Additionally, dummy transistor DTS is arranged in between selecting transistor ST2 and memory transistor MT0 so that the current paths are connected in series. Although the dummy transistors DTD and DTS includes similar structure to memory cell transistor MT, they are not used for data storing and becomes ON state when writing, reading, and erasing data. The number of dummy transistor DTD and/or dummy transistor DTS does not necessarily have to be 1, there may be multiple numbers of them.

For each of memory groups GP0 to GP3, the gate of the selecting transistor ST1 makes a common connection to one of the corresponding selecting gate line SGDI0 to SGDI3, and the gate of the selecting transistor ST2 makes a common connection to one of the corresponding selecting gate line SGSI0 to SGSI3. Within the same block BLK0, the control gates of memory cell transistors MT0 to MT7 each makes a common connection to word line WL0 to WL7, the control gates of back gate transistors BT makes a common connection to back gate lines BGI (for blocks BLK0 to BLK3, they are BGI0 to BGI3), the control gates of dummy transistors DTD and DTS each makes a common connection to the dummy word line WLDD and WLDS.

That is, word lines WL0 to WL7, back gate lines BGI, dummy word lines WLDD and WLDS make a common connection with multiple memory groups GP0 to GP3 within the same block BLK; as opposed to the selecting gate lines SGDI and SGSI, even though they are within the same block BLK, they are individual for each memory groups GP0 to GP3.

Of the NAND strings 18 arranged in a matrix form within memory cell array 10, for the NAND strings 18 in the same row, the other end of the current path of the selecting transistor ST1 is commonly connected to one of the n (n is a natural number) bit lines BL (BL0 to BLn). That is, bit lines BL commonly connect to the NAND strings 18 in multiple blocks BLK. In addition, the other end of the current path of the selecting transistor ST2 is commonly connected with the source lines SL. Source lines SL are commonly connected with the NAND strings 18 in multiple blocks BLK.

As previously stated, the data of the memory cell transistor MT within the same block BLK are erased at the same time. On the other hand, reading and writing data are performed at once for the multiple memory cell transistors MT that are commonly connected to one of the word line WL within one of the memory groups GP. This unit is called a "page."

Figure 3:
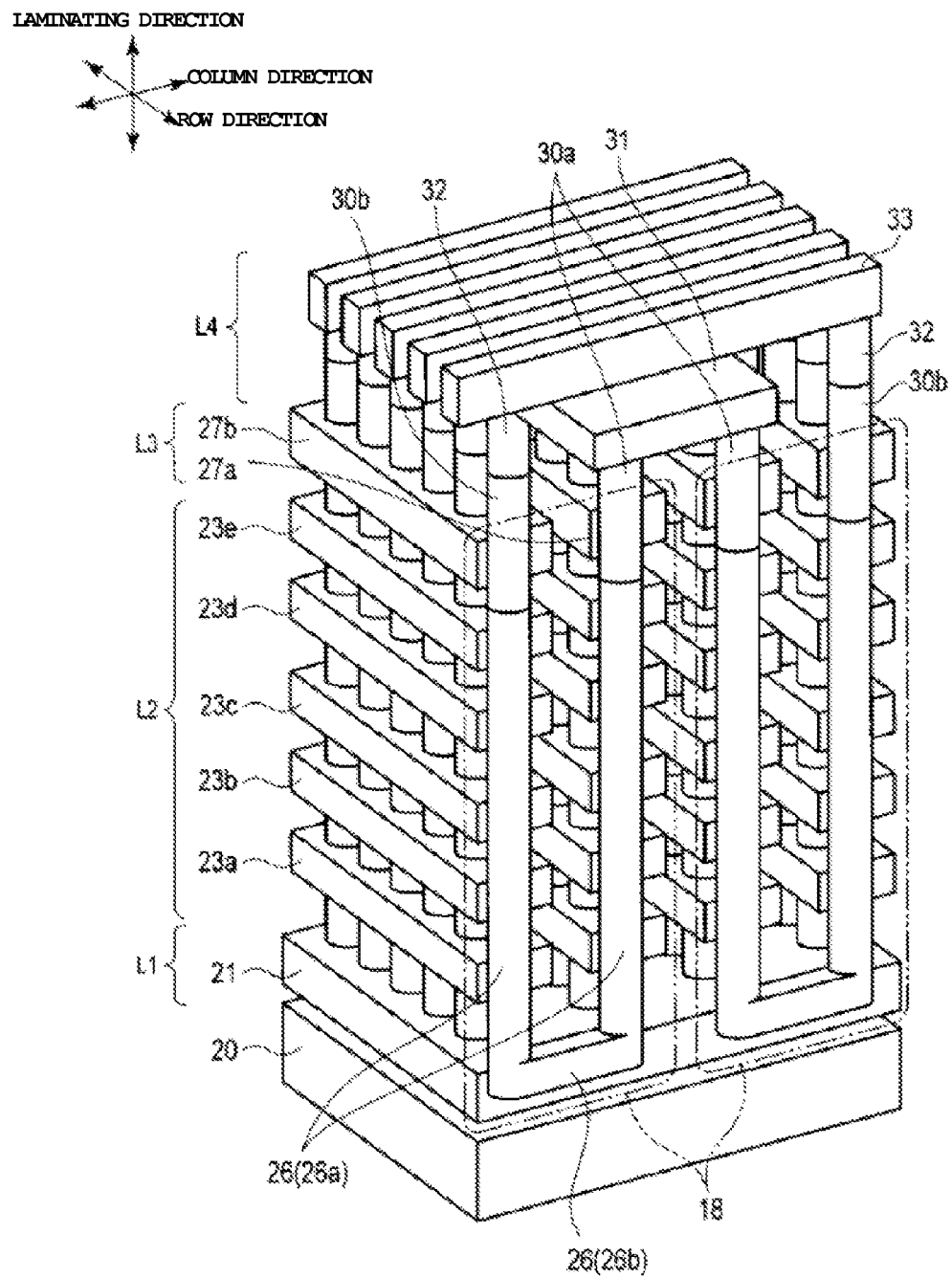
FIG. 3 is a perspective view of memory cell array.
Figure 4:
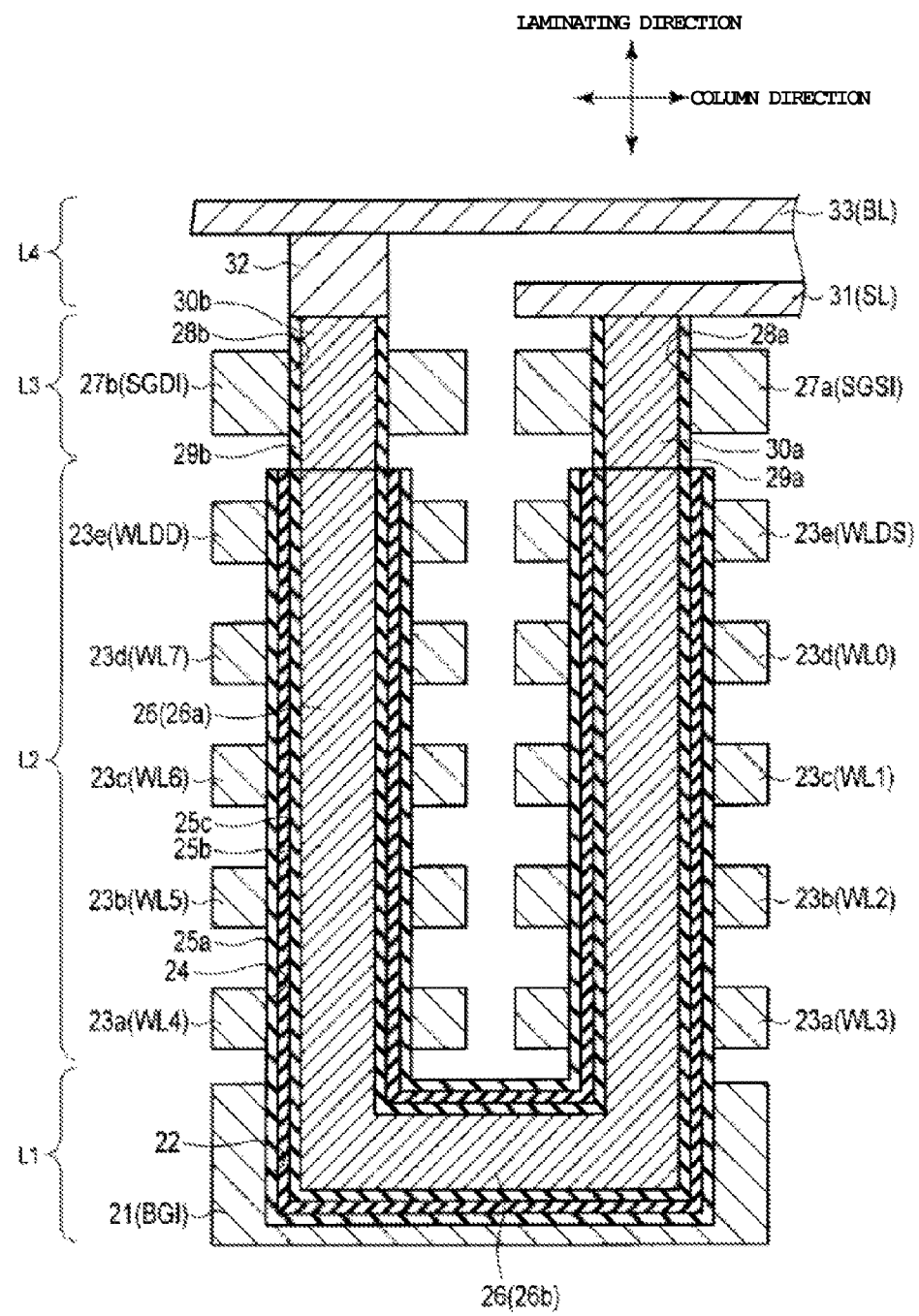
FIG. 4 is a cross sectional view of memory cell array.

Next, the three dimensional laminated (stacked) structure of memory cell array 10 will be explained using FIG. 3 and FIG. 4. FIG. 3 and FIG. 4 are the perspective view and cross sectional view of the memory cell array 10, respectively.

Memory cell array 10 possess a back gate transistor layer L1, memory cell transistor layer L2, selecting transistor layer L3, and wiring layer L4; they are laminated in order through the insulating layer (not shown in the drawing) onto the semiconductor substrate 20. Back gate transistor layer L1 functions as back gate transistor BT. Memory cell transistor layer L2 functions as memory cell transistors MT0 to MT7, and dummy transistors DTD and DTS. Selecting transistor layer L3 functions as selecting transistors ST1 and ST2. Wiring layer L4 functions as source line SL and bit line BL.

Back gate transistor layer L1 possess a back gate conductive layer 21 that functions as back gate line BGI. Back gate conductive layer 21 is formed to expand 2-dimensionally in the row direction and column direction parallel to the semiconductor substrate 20. Back gate conductive layer 21 is separated for each block BLK. Back gate conductive layer 21 is composed of, for example, conductive crystalline silicon. In addition, back gate conductive layer 21 possesses a back gate hole 22 as shown in FIG. 4. Back gate hole 22 is formed as if digging through the back gate conductive layer 21. Back gate hole 22 is formed almost rectangular having the column direction as its longitudinal direction when viewed from the top surface.

Memory cell transistor layer L2 possesses word line conductive layers 23a to 23d and dummy word line conductive layer 23e. Conductive layers 23a to 23e are each laminated so that the interlayer insulating layer (not shown in the drawing) goes in between them. Conductive layers 23a to 23e are formed in a stripe form in the row direction with a designated pitch in the column direction. Conductive layers 23a to 23e are composed of, for example, conductive crystalline silicon. Conductive layer 23a functions as the control gates (word lines WL3 and WL4) of the memory cell transistors MT3 and MT4, conductive layer 23b functions as the control gates (word lines WL2 and WL5) of the memory cell transistors MT2 and MT5, conductive layer 23c functions as the control gates (word lines WL1 and WL6) of the memory cell transistors MT1 and MT6, and conductive layer 23d functions as the control gates (word lines WL0 and WL7) of the memory cell transistors MT0 and MT7. Additionally, the conductive layer 23e functions as the control gates (dummy word lines WLDD and WLDS) of the dummy transistors DTD and DTS.

As shown in FIG. 4, the memory cell transistor layer L2 possesses a memory hole 24. The memory hole 24 is formed so that it penetrates through conductive layers 23a to 23e. The memory hole 24 is formed so that it aligns with the edge in column direction of the back gate hole 22.

As shown in FIG. 4, back gate transistor layer L1 and memory cell transistor layer L2 possess a block insulating layer 25a, charge storage layer 25b, tunnel insulating layer 25c, and semiconductor layer 26. The semiconductor layer 26 functions as the body (where the channel is formed) of the NAND string 18.

As shown in FIG. 4, the block insulating layer 25a is formed with a designated thickness on the side wall facing the back gate hole 22 and memory hole 24. The charge storage layer 25b is formed with a designated thickness on the lateral surface of the insulating layer 25a. The tunnel insulating layer 25c is formed with a designated thickness on the lateral surface of the charge storage layer 25b. The semiconductor layer 26 is formed touching the lateral surface of the tunnel insulating layer 25c. The semiconductor layer 26 is formed filling up the back gate hole 22 and memory hole 24.

The semiconductor layer 26 is formed in a U shape when viewed from the row direction. That is, the semiconductor layer 26 possesses a pair of column 26a that extends in the vertical direction with respect to the surface of the semiconductor substrate 20, and a linkage 26b that links the bottom end of the pair of column 26a.

The block insulating layer 25a and tunnel insulating layer 25c may be composed of, for example, silicon dioxide ($SiO_2$). The charge storage layer 25b may be composed of, for example, silicon nitride (SiN). Semiconductor layer 26 may be composed of, for example, polycrystalline silicon. These block insulating layer 25a, charge storage layer 25b, tunnel insulating layer 25c, and semiconductor layer 26 makes up MONOS-type transistor that functions as memory transistor MT, and dummy transistors DTD and DTS.

In other words, the above stated structure of the back gate transistor layer L1, the tunnel insulating layer 25c is formed surrounding the linkage 26b. The charge storage layer 25b is formed surrounding the tunnel insulating layer 25c. The block insulating layer 25a is formed surrounding the charge storage layer 25b. The back gate conductive layer 21 is formed surrounding the block insulating layer 25a.

Additionally, in other words, the above stated structure of the memory cell transistor layer L2, the tunnel insulating layer 25c is formed surrounding the column 26a. The charge storage layer 25b is formed surrounding the tunnel insulating layer 25c. The block insulating layer 25a is formed surrounding the charge storage layer 25b. Word line conductive layers 23a to 23d are formed surrounding the block insulating layer 25a.

As shown in FIGS. 3 and 4, the selecting transistor layer L3 possesses conductive layer 27a and 27b. Conductive layers 27a and 27b is formed in a stripe form in the row direction with a designated pitch in the column direction. A pair of conductive layer 27a and a pair of conductive layer 27b are arranged alternatively in the column direction. The conductive layer 27a is formed on the upper layer of one of the column 26a and the conductive layer 27b is formed on the upper layer of the other column 26a. Conductive layers 27a and 27b are composed of, for example, conductive polycrystalline silicon. The conductive layer 27a functions as the gate of the selecting transistor ST2 (selecting gate line SGS), and the conductive layer 27b functions as the gate of the selecting transistor ST1 (selecting gate line SGD).

As shown in FIG. 4, the selecting transistor layer L3 possesses holes 28a and 28b. Holes 28a and 28b each penetrates through conductive layers 27a and 27b. Holes 28a and 28b each aligns with memory holes 24. The selecting transistor layer L3 possesses gate insulating layers 29a and 29b, and semiconductor layers 30a and 30b. Gate insulating layers 29a and 29b are each formed on the side wall facing holes 28a and 28b. Semiconductor layers 30a and 30b are each formed contacting the gate insulating layers 29a and 29b as a columnar extending in the vertical direction with respect to the surface of the semiconductor substrate 20. Gate insulating layers 29a and 29b may be composed of, for example, silicon dioxide ($SiO_2$). Semiconductor layers 30a and 30b may be composed of, for example, polycrystalline silicon.

In other words, the structure of the above stated selecting transistor layer L3, the gate insulating layer 29a is formed surrounding the columnar semiconductor layer 30a. The conductive layer 27a is formed surrounding the gate insulating layer 29a. Additionally, the gate insulating layer 29b is formed surrounding the columnar semiconductor layer 30b. The conductive layer 27b is formed surrounding the gate insulating layer 29b.

As shown in FIGS. 3 and 4, the wiring layer L4 is formed on the upper layer of the selecting transistor layer L3. The wiring layer L4 possesses a source line layer 31, plug layer 32, and bit line layer 33. The source line layer 31 is formed in a board shape extending in the row direction. The source line layer 31 is formed contacting the upper surface of the semiconductor layer 30a that are adjacent in pairs in the column direction. The plug layer 32 is formed contacting the upper surface of the semiconductor layer 30b and extending in the vertical direction with respect to the semiconductor substrate 20. The bit line layer 33 is formed in a stripe form in the column direction with a designated pitch in the row direction. The bit line layer 33 is formed contacting the upper surface of the plug layer 32. The source line layer 31, plug layer 32, and bit line layer 33 may be formed by metals such as tungsten (W). The source line layer 31 functions as the source line SL, and the bit line layer 33 functions as the bit line BL.

Figure 5:
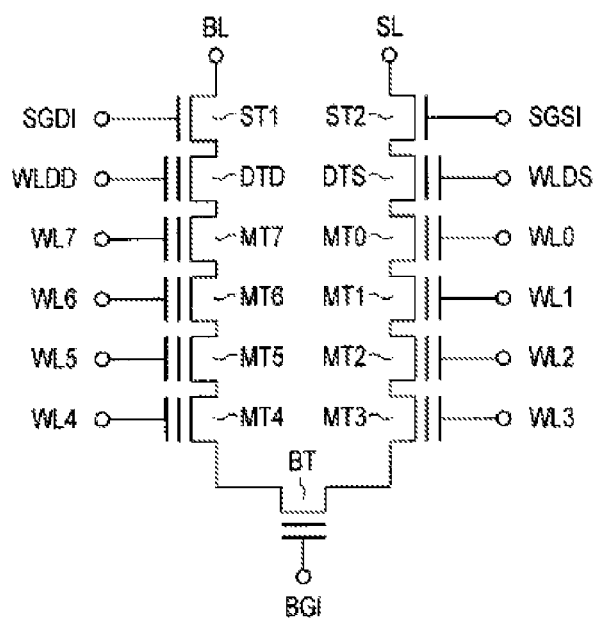
FIG. 5 is a circuit diagram of NAND string.

Equivalent circuit of the NAND string 18 shown in FIGS. 3 and 4 are shown in FIG. 5. The NAND string 18 possesses selecting transistors ST1 and ST2, memory transistors MT0 to MT7, dummy transistors DTD and DTS, and back gate transistors BT. As previously stated, memory cell transistors MT are serially connected in between the selecting transistors ST1 and ST2.

The back gate transistor BT is serially connected in between the memory cell transistors MT3 and MT4. The dummy transistor DTD is serially connected in between the selecting transistor ST1 and memory cell transistor MT7. The dummy transistor DTS is serially connected in between the selecting transistor ST2 and memory cell transistor MT0. Dummy transistors DTD, DTS, and the back gate transistor BT becomes ON state when reading and erasing data. When writing data, they become ON state as necessary.

The control gate of memory cell transistor MT is connected to the word line WL, the control gate of dummy transistors DTD and DTS are each connected to dummy word lines WLDD and WLDS, and the control gate of the back gate transistor BT is connected to back gate line BGI. The collection of multiple NAND strings 18 arranged along the row direction in FIG. 3 is what is equivalent to the memory groups GP explained in FIG. 2.

Structure of the memory cell array 10 is not limited as above description. A memory cell array formation may be disclosed in U.S. patent application Ser. No. 12/532,030. U.S. patent application Ser. No. 12/532,030, the entire contents of which are incorporated by reference herein.

[1-2] Structure of the Row Decoder 11

Figure 6:
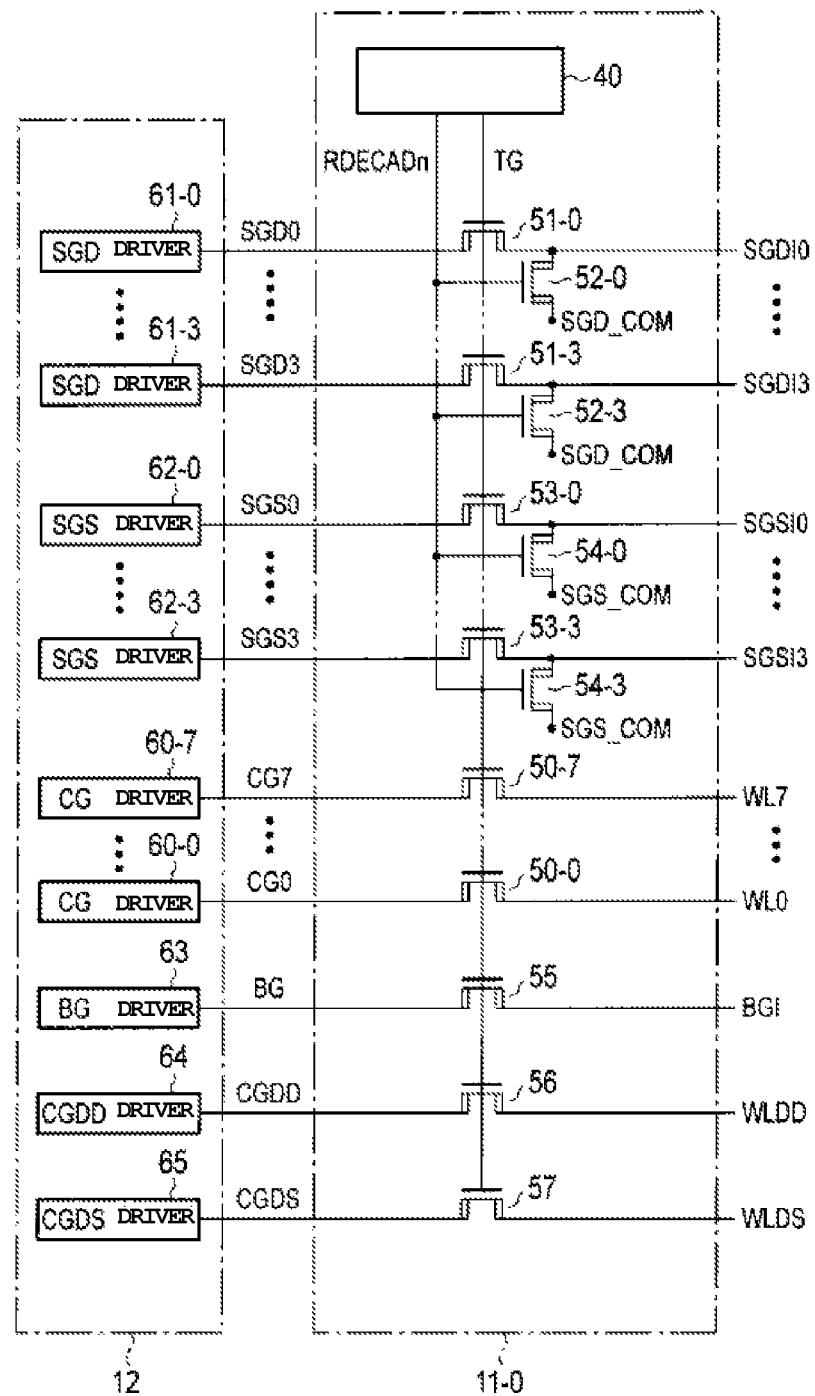
FIG. 6 is a circuit diagram of row decoder and driver circuit.

Next, the structure of the row decoder 11 will be explained. Row decoders 11-0 to 11-3 are each provided with the associated blocks BLK0 to BLK3, they are provided in order to select or deselect the blocks BLK0 to BLK3. FIG. 6 is the circuit diagram of row decoder 11-0 and driver circuit 12. The structures of row decoders 11-1 to 11-3 are similar to row decoder 11-0 shown in FIG. 6.

The row decoder 11-0 possesses the block decoder 40 and high-voltage n channel MOS transistors 50 to 54 (50-0 to 50-7, 51-0 to 51-3, 52-0 to 52-3, 53-0 to 53-3, 54-0 to 54-3), 55 to 57.

For example, during reading, writing, and erasing data, the block decoder 40 decodes the block address BA assigned from control circuit 16. Based on the decoding result, signals TG and RDECADn are generated. To be more specific, when the block address BA is pointed to block BLK0 that corresponds with the row decoder 11-0, the block decoder 40 asserts signal TG ("H" level for the present example), and negates signal RDECADn ("L" level for the present example; for instance, ground voltage Vss (=0V)). In addition, if the block address BA is not pointed to block BLK0 that corresponds with the row decoder 11-0, the block decoder 40 negates signal TG and asserts signal RDECADn.

Transistor 50 is for transferring voltage to the word line WL of the selecting block BLK. For each of the transistors 50-0 to 50-7, one end of the current paths connects to each of the word lines WL0 to WL7 of the corresponding block BLK0, the other ends are each connected to signal lines CG0 to CG7, and corresponding signals TG from the block decoder 40 are assigned to the gate.

Therefore, for the row decoder 11-0 that corresponds with the selected block BLK0, transistors 50-0 to 50-7 becomes ON state, and word lines WL0 to WL7 are connected to signal lines CG0 to CG7. On the other hand, for the row decoders 11-1 to 11-3 that corresponds with the unselected blocks BLK1 to BLK3, transistors 50-0 to 50-7 becomes OFF state, and the word lines WL0 to WL7 are separated from signal lines CG0 to CG7.

Transistors 51 and 52 are for transferring voltage to the selecting gate lines SGDI. For each of the transistors 51-0 to 51-3, one end of the current paths connects to the selecting gate lines SGDI0 to SGDI3 of the corresponding block BLK0, the other ends are connected to signal lines SGD0 to SGD3, and signals TG are assigned to the gate.

For each of the transistors 52-0 to 52-3, one end of the current paths connects to the selecting gate lines SGDI0 to SGDI3 of the corresponding block BLK0, the other ends are connected to node SGD_COM, and signals RDECADn are assigned to the gate. Node SGD_COM is a voltage that turns the selecting transistor ST1 to OFF state, 0V for example.

Therefore, for the row decoder 11-0 that corresponds with the selected block BLK0, transistors 51-0 to 51-3 becomes ON state and transistors 52-0 to 52-3 becomes OFF state. Consequently, the selecting gate lines SGDI0 to SGDI3 of the selected block BLK0 are connected to signal lines SGD0 to SGD3. On the other hand, for the row decoders 11-1 to 11-3 that correspond with the unselected blocks BLK1 to BLK3, transistors 51-0 to 51-3 become OFF state and transistors 52-0 to 52-3 become ON state. Consequently, the selecting gate lines SGDI0 to SGDI3 of the unselected blocks BLK1 to BLK3 are connected to node SGD_COM.

Transistors 53 and 54 are for transferring voltage to the selecting gate line SGSI; its connection and actions are equivalent to that of transistors 51 and 52 with the selecting gate line SGDI being replaced with the selecting gate line SGSI. That is, for the row decoder 11-0 that corresponds with the selected block BLK0, transistors 53-0 to 53-3 become ON state, and transistors 54-0 to 54-3 become OFF state. On the other hand, for the row decoders 11-1 to 11-3 that correspond with the unselected blocks BLK1 to BLK3, transistors 51-0 to 51-3 become OFF state, and transistors 52-0 to 52-3 become ON state.

The transistor 55 is for transferring voltage to the back gate line BGI. For transistor 55, one end of the current path connects to the back gate line BGI of the corresponding block BLK0, the other end is connected to signal line BG, and signal TG is assigned to the gate. Therefore, for the row decoder 11-0 that corresponds with the selected block BLK0, transistor 55 becomes ON state; for the row decoders 11-1 to 11-3 that correspond with the unselected blocks BLK1 to BLK3, transistor 55 becomes OFF state.

Transistors 56 and 57 are each for transferring voltages of dummy word lines WLDD and WLDS, respectively. For transistor 56, one end of the current path connects to the dummy word line WLDD of the corresponding block BLK0, the other end is connected to signal line CGDD, and signal TG is assigned to the gate. For transistor 57, one end of the current path connects to the dummy word line WLDS of the corresponding block BLK0, the other end is connected to signal line CGDS, and signal TG is assigned to the gate. Therefore, for the row decoder 11-0 that corresponds with the selected block BLK0, transistors 56 and 57 become ON state; for the row decoders 11-1 to 11-3 that correspond with the unselected blocks BLK1 to BLK3, transistors 56 and 57 become OFF state.

[1-3] Structure of the Driver Circuit 12

Next, the structure of the driver circuit 12 will be explained. The driver circuit 12 receives various voltages from the voltage generation circuit 15 that are necessary for writing, reading, and erasing data. The driver circuit 12 transfers voltages necessary for writing, reading, and erasing data to the signal lines CG0 to CG7, SGDD0 to SGDD3, SGSD0 to SGSD3, and each of the BG. As shown in FIG. 6, the driver circuit 12 possesses CG driver 60 (60-0 to 60-7), SGD driver 61 (61-0 to 61-3), SGS driver 62 (62-0 to 62-3), BG driver 63, CGDD driver 64, and CGDS driver 65.

Each of CG drivers 60-0 to 60-7 transfers necessary voltages to signal lines CG0 to CG7 (word lines WL0 to WL7). Each of SGD drivers 61-0 to 61-3 transfers necessary voltages to signal lines SGD0 to SGD3 (selecting gate lines SGDI0 to SGDI3). Each of SGS drivers 62-0 to 62-3 transfers necessary voltages to signal lines SGS0 to SGS3 (selecting gate lines SGSI0 to SGSI3). The BG driver 63 transfers necessary voltage to signal line BG (back gate line BGI). The CGDD driver

64 and CGDS driver 65 each transfer necessary voltages to signal lines CGDD and CGDS (dummy word lines WLDD and WLDS).

[2] Erase Operation of the NAND Flash Memory 1

Next, the erase operation of the above stated structured NAND flash memory 1 will be explained.

First, the types of voltages used during the erase operation will be explained. Unlike flat panel NAND flash memories, the laminated NAND flash memory 1 performs erase operation by boosting the channel electric potential of the memory cell transistor MT using the GIDL (Gate Induced Drain Leakage) hole current generated at the channel, the gate edge in the selecting transistor. In the explanations below, for example, the selecting transistor ST1 connected to the bit line BL generates GIDL, and the selecting transistor ST2 connected to the source line SL does not generate GIDL.

In the erase operation, the bit line BL and source line SL are each provided with voltage VERA (the erasing voltage). The gate of the selecting transistor ST1 (selecting gate line SGDI) that generates GIDL is provided with voltage VERA_GIDL (first voltage), the gate of the selecting transistor ST2 (selecting gate line SGSI) that does not generate GIDL is provided with voltage VERA_NOGIDL (second voltage). The control gate of the dummy transistors DTD and DTS (dummy word lines WLDD and WLDS) are each provided with voltage VERA_DWL (third voltage). The control gate of the back gate transistor BT (back gate line BGI) is provided with voltage VERA_BG (fourth voltage). Word lines WL0 to WL7 are provided with, for instance, ground voltage Vss (=0V).

The sequence of erasing data of the block BLK includes: (1) Action to provide various erasing voltages to block BLK. (2) an erasing verification that determines whether the threshold voltage of all the memory cell transistors MT within the block BLK became lower than the designated threshold voltage that represents the erasing state. (3) Action to increase the erasing voltage by the step up voltage in the case when there are memory cell transistor (s) MT that does not pass the erasing verification. Loops (1) to (3) are repeated until the erasing verification passes through. In the explanations below, the loops (1) to (3) are called the erasing loops, the multiple loops repeated until they pass through the erasing verification are called the erasing sequence.

Figure 7:
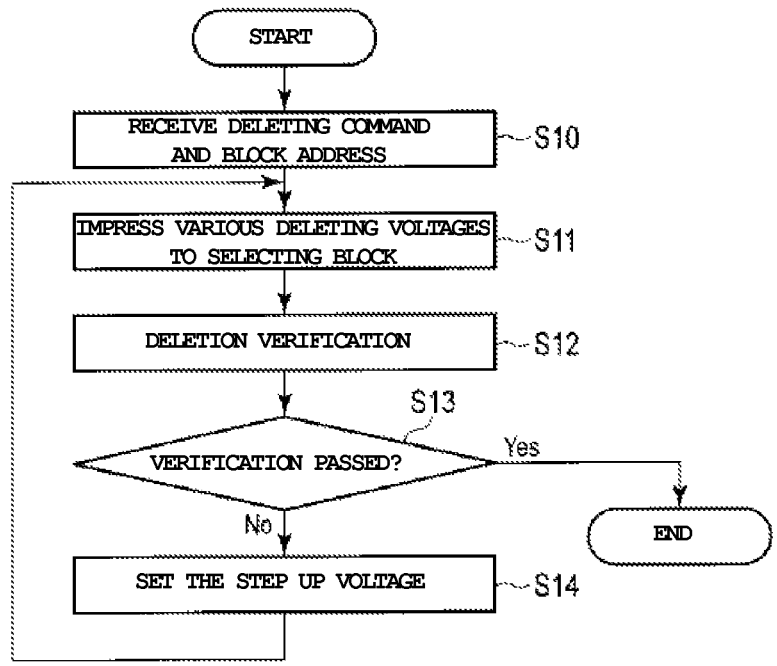
FIG. 7 is a flow chart representing an erasing sequence.

FIG. 7 is the flow chart that represents the erasing sequence. First, the control circuit 16 receives the erasing command from the exterior host device. On this occasion, the block address BA of the block being the erasing target is also received (step S10). By receiving this erasing command, the control circuit 16 starts the erasing sequence. Hereafter, the erasing target block is assumed to be BLK0 and called the selected block.

Next, the driver circuit 12, row decoder 11-0, and BL/SL driver 14 impress various voltages for the erase operation at the designated timing to the selected block BLK0 based on the command of the control circuit 16 (step S11). To be more specific, based on the command of the control circuit 16, the BL/SL driver 14 impresses voltage VERA (for instance, 15V to 20V) to the bit line BL and source line SL. Additionally, based on the command of the control circuit 16, the driver circuit 12 and row decoder 11-0 provide voltage VERA_NOGIDL to the selecting gate line SGSI0, voltage VERA_BG to the back gate line BGI.

Of the various voltages for the erase operation, voltage VERA has the highest positive voltage. In order not to generate GIDL at the selecting transistor ST2 connected to the source line SL, voltage VERA_NOGIDL is set almost equivalent to voltage VERA. Voltage VERA_BG is the voltage to conduct the back gate transistor BT, it is set to a lower voltage than voltage VERA. In one example, voltage VERA_BG is about 7V.

The driver circuit 12 and row decoder 11-0 provides voltage VERA_GIDL to the selecting gate line SGDI0, voltage VERA_DWL to the dummy word lines WLDD and WLDS. In order to generate GIDL at the selecting transistor ST1 connected to the bit line BL, voltage VERA_GIDL is set to a lower voltage than voltage VERA.

The dummy transistor DTD is prepared so that GIDL is not generated at the gate of the memory cell transistor MT7 by lowering the drain voltage of the memory cell transistor MT7 that is closest to the selecting transistor ST1. To accomplish such function, voltage VERA_DWL is set to, for example, an intermediate voltage of VERA_NOGIDL and 0V. Similarly, the dummy transistor DTS is prepared so that GIDL is not generated at the gate of the memory cell transistor MT0 by lowering the drain voltage of the memory cell transistor MT0 that is closest to the selecting transistor ST2. The voltage VERA_DWL is the voltage to conduct dummy transistors DTD and DTS. Although in the present embodiment, the voltage to be provided to the dummy word lines WLDD and WLDS is the same VERA_DWL, but it is not limited to this; the most suitable voltage for each of the dummy word lines WLDD and WLDS may be set.

In the present embodiment, the various voltages for the erase operation are, for example, "VERA=VERA_NOGIDL>VERA_GIDL>VERA_DWL>VERA_BG." From such voltage provision, the channel voltage of the memory cell transistors MT0 to MT7 are boosted to the voltage close to voltage VERA.

The driver circuit 12 and row decoder 11-0 will provide, for example, 0V to the word lines WL0 to WL7. From this, the electron stored on the charge storage layer of the memory cell transistors MT0 to MT7 are pulled away towards the body side, and the data is erased.

Next, the control circuit 16 performs the erasing verification to all memory cell transistors MT within the selected block BLK0 (step S12). That is, the control circuit 16 checks whether the threshold voltage of all the memory cell transistors MT within the selected block BLK0 became lower than the designated threshold voltage that represents the erasing state. Other than the threshold voltage to be checked varies, the erasing verification is the same as an ordinary reading action, general erasing verifying action may be applied for the present embodiment.

If the erasing verification passes in step S13, the erasing sequence ends. The condition for the erasing verification to pass is if the threshold voltage of all the memory cell transistors MT within the selected block BLK0 becomes lower than the designated threshold voltage that represents the erasing state. The condition to pass the erasing verification may also be set to when a predetermined number of threshold voltages of the memory cell transistors MT within the selected block BLK0 becomes lower than the designated threshold voltage that represents the erasing state.

If the erasing verification does not pass (it fails) in step S13, the control circuit 16 sets the step up voltage of the various voltages for the erase operation (step S14). In the present embodiment, for the various voltages for the erase operation (VERA, VERA_NOGIDL, VERA_GIDL, VERA_DWL, and VERA_BG), step up voltages are to be individually controlled (adjusted).

Figure 8:
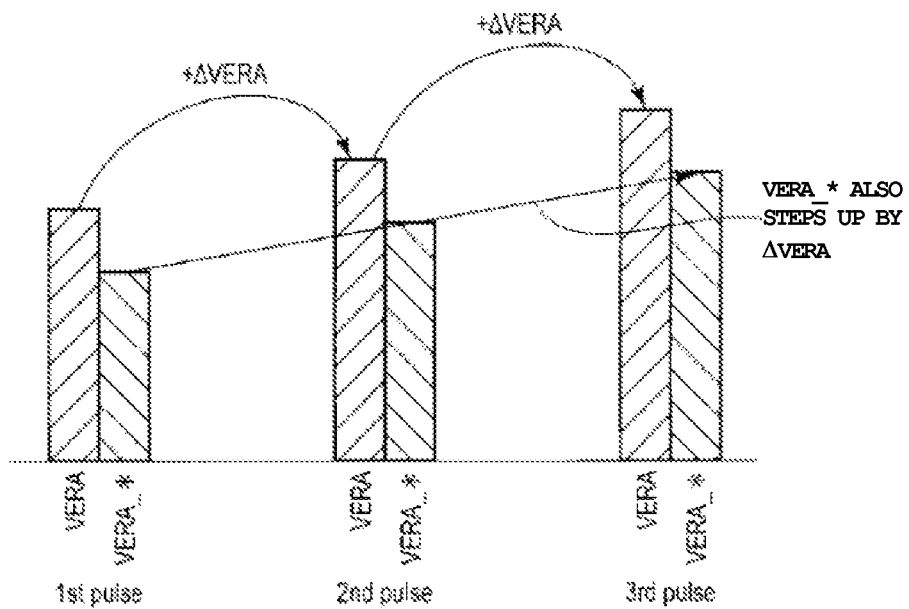
FIG. 8 is a diagram explaining the first example of the step up voltage for each erasing loop.

FIG. 8 is the diagram explaining the first example of the step up voltage for each erasing loop. The number of pulse in FIG. 8 corresponds to the number of erasing loops. As the number of erasing loops increases, voltage VERA steps up with a step up voltage of AVERA. Step up voltage AVERA is fixed for each erasing loop. Similarly, as the number of erasing loops increases, voltage VERA_* steps up with a step up voltage of ΔVERA. That is, if the step up voltage of VERA_* is ΔVERA_*, then "ΔVERA_*=ΔVERA."

Those that apply to voltage VERA_* in FIG. 8 may be, for instance, voltage VERA_GIDL, and voltage VERA_NOGIDL. For voltage VERA_GIDL, by maintaining a fixed voltage difference with voltage VERA, GIDL is generated at the same voltage condition for each erasing loop. As for voltage VERA_NOGIDL, by maintaining a fixed voltage difference with voltage VERA, it is designed to not generate GIDL even if the number of erasing loop increases and voltage VERA steps up.

Figure 9:
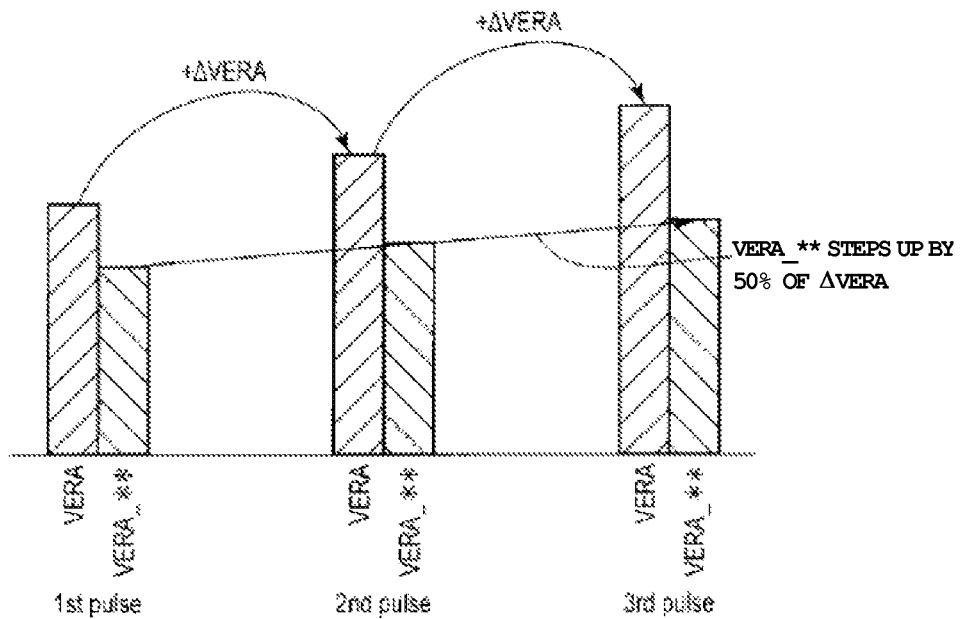
FIG. 9 is a diagram explaining the second example of the step up voltage for each erasing loop.

FIG. 9 is the diagram explaining the second example of the step up voltage for each erasing loop. As the number of erasing loop increases, voltage VERA steps up with a step up voltage of ΔVERA. On the other hand, as the number of erasing loop increases, voltage VERA_ steps up with step up voltage less than ΔVERA. For instance, if the step up voltage of voltage VERA_ is ΔVERA_, then "ΔVERA_=ΔVERA×50%." The ratio of step up voltage ΔVERA_** to step up voltage ΔVERA may be set at one's discretion within the range of greater than 0%, less than 100%.

Those that apply to voltage VERA_** in FIG. 9 may be, for instance, voltage VERA_DWL. For voltage VERA_DWL to achieve a function to not generate GIDL at the gate end of the memory transistor MT, it should be set at the intermediate voltage of voltage VERA_NOGIDL (voltage of selecting gate line SGSI) and 0V (voltage of word line WL).

Figure 10:
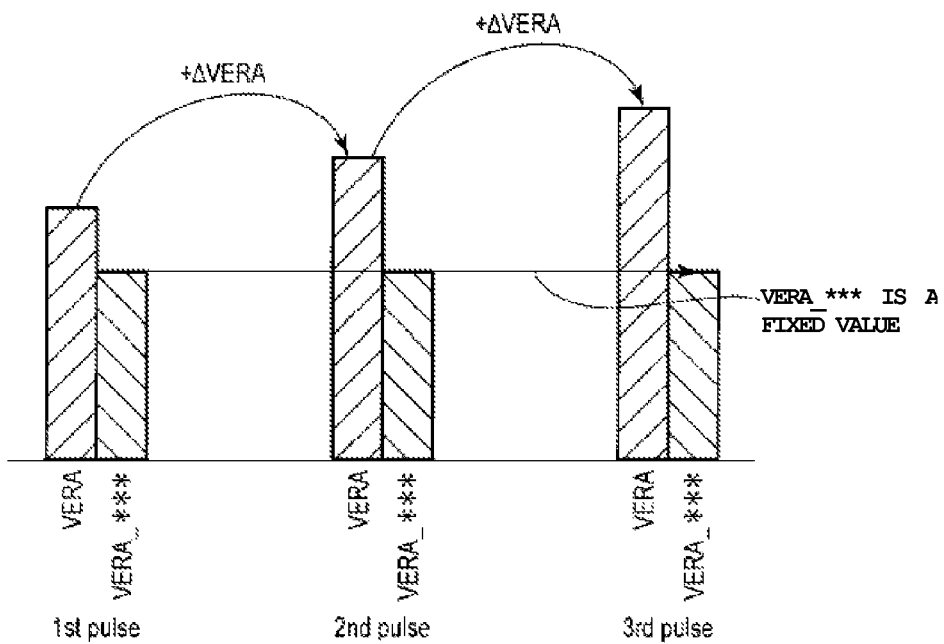
FIG. 10 is a diagram explaining the third example of the step up voltage for each erasing loop.

FIG. 10 is the diagram explaining the third example of the step up voltage for each erasing loop. As the number of erasing loop increases, voltage VERA steps up with a step up voltage of ΔVERA. On the other hand, even if the number of erasing loop increases, voltage VERA_* does not step up. That is, the step up voltage of voltage VERA_* is 0% of voltage ΔVERA.

Those that apply to voltage VERA_*** in FIG. 10 may be, for instance, voltage VERA_BG. During erase operation, the back gate transistor BT should be at conduction state. As previously stated, since back gate transistor BT possess a charge storage layer similar to the memory cell transistor MT, if the number of electrons stored on the charge storage layer changes, then the threshold voltage also changes. Thus, because voltage VERA_BG just needs to avoid back gate transistor BT from being erased (that is, if the electron is not pulled out from the charge storage layer of the back gate transistor BT), as long as the voltage is high to some extent, it does not need to step up.

With the above stated control, the step up voltage of the various voltages for the erase operation (VERA, VERA_NOGIDL, VERA_GIDL, VERA_DWL, and VERA_BG) in step S14 are set. Based on the control of control circuit 16, voltage generation circuit 15 generates the various voltages for the erase operation (VERA, VERA_NOGIDL, VERA_GIDL, VERA_DWL, and VERA_BG). Driver circuit 12, row decoder 11-0, and BL/SL driver 14 provides the various voltages received from the voltage generation circuit 15 to the selected block BLK0 at the designated timing. After that, until the erasing verification passes, step S11 to step S14 are repeated.

In the above explanation, although step up voltage in FIG. 8 is applied to voltage VERA_GIDL, it is not limited to this. If the hole current due to GIDL increases as the voltage difference of voltage VERA and voltage VERA_GIDL becomes larger, then voltage difference of voltage VERA and voltage VERA_GIDL may be controlled so that they become larger as the number of erasing loop increases by applying step up voltage in FIG. 9 to voltage VERA_GIDL. Additionally, if one desires to increase the voltage difference of voltage VERA and voltage VERA_GIDL even further, then step up voltage in FIG. 10 may be applied to voltage VERA_GIDL. For the other voltages, suitable voltages to perform the ideal erase operation may be selected and applied as well.

[3] Effects

As detailed above, in the Embodiment 1, based on the control of the control circuit 16, driver circuit 12, row decoder 11 and BL/SL driver 14 provides the various voltages (VERA, VERA_NOGIDL, VERA_GIDL, VERA_DWL, and VERA_BG) that steps up as the number of erasing loop increases to the selected block BLK. The control circuit 16 individually adjusts the step up voltage of the various voltages used when erasing data.

Therefore, according to the Embodiment 1, even if the types of voltages to be used for the erase operation increases, the step up amount of the various voltages may be ideally controlled. From this, a stable erase operation may be performed. To be specific, since the desired GIDL may be generated, body may be boosted to the desired voltage, additionally reducing the time it takes for boosting. This enables reducing the time for the erase operation.

In addition, since the various voltages used for erasing data may be ideally controlled, the number of erasing loop may be decreased. This enables reducing the erasing time even more.

Embodiment 2

The Embodiment 2 sets the voltage necessary for the erase operation other than voltage VERA by providing voltage VERA to the bit line BL and/or source line SL, and using the capacitive coupling of the bit line BL and/or the source line SL during erasing. The erasing method using the capacitive coupling of the bit line BL and/or the source line SL is described in U.S. patent application Ser. No. 13/423,610, the entire contents of which are incorporated by reference herein.

[1] Structure of the NAND Flash Memory 1

Figure 11:
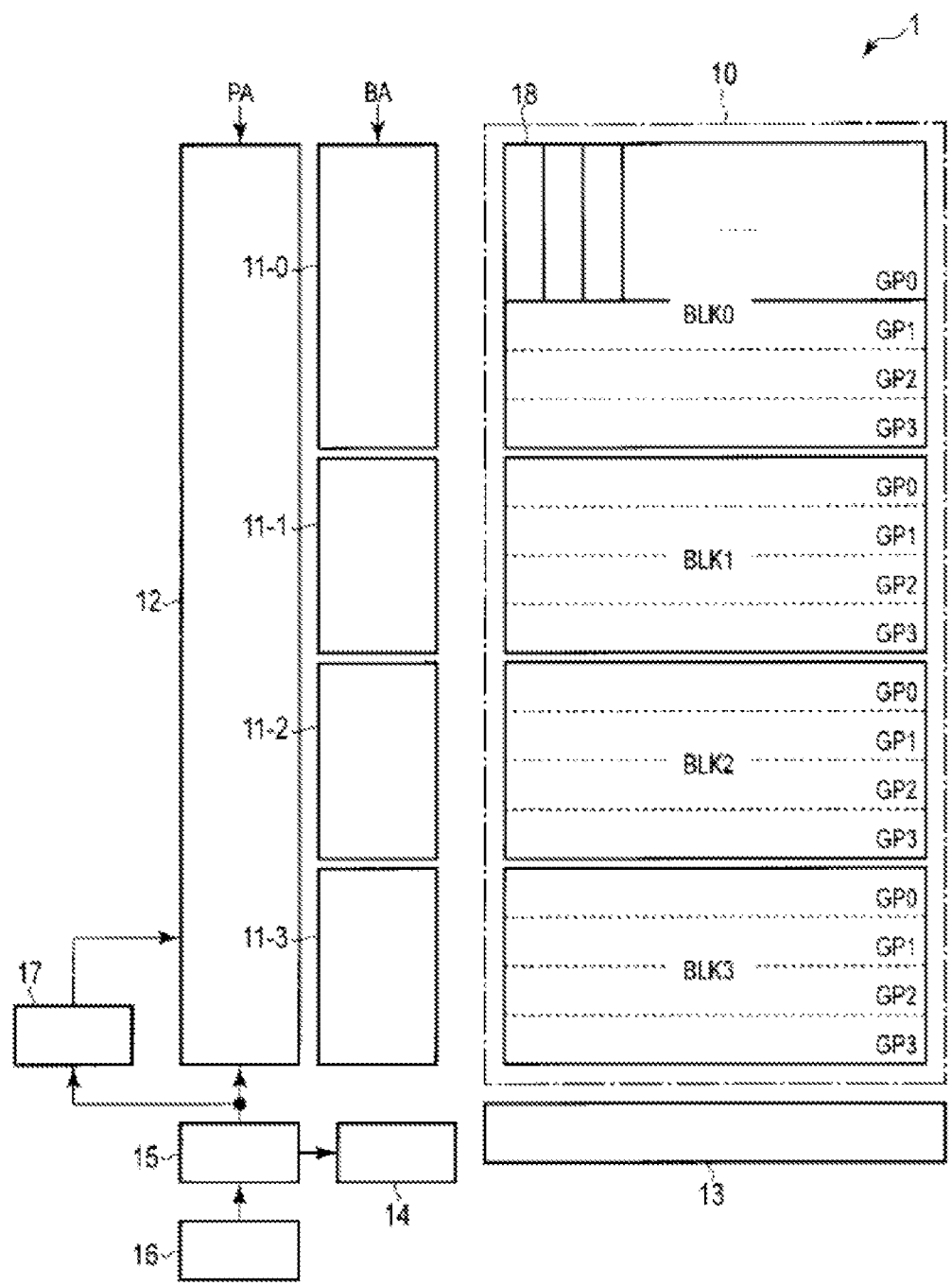
FIG. 11 is a block diagram of NAND flash memory according to a second embodiment.

FIG. 11 is the block diagram of NAND flash memory 1 relating to the Embodiment 2.

The NAND flash memory 1 relating to the Embodiment 2 possesses a detection circuit 17 in addition to the structure in FIG. 1. The detection circuit 17 monitors voltage VERA generated by the voltage generation circuit 15 during data erasing. The driver circuit 12 is controlled based on the level of voltage VERA.

Figure 12:
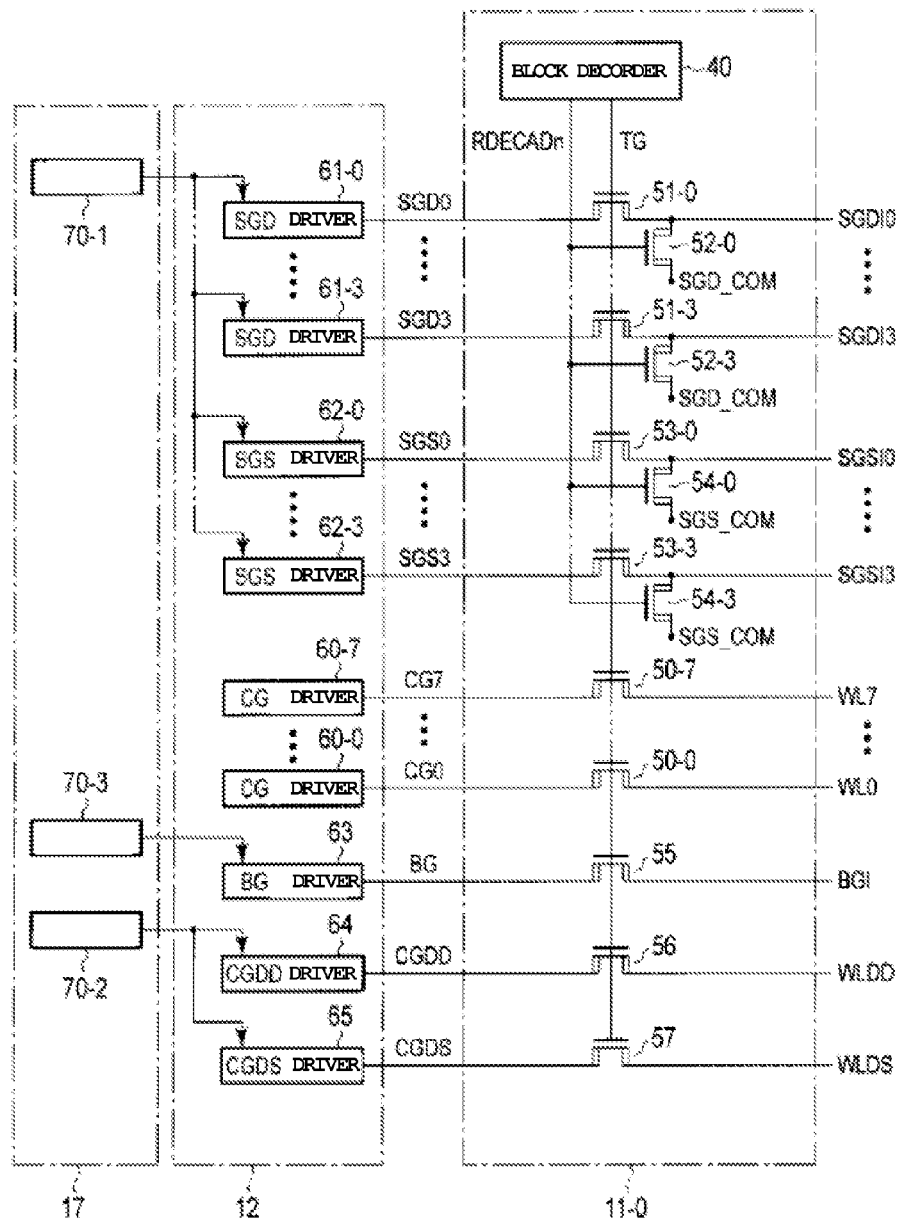
FIG. 12 is a block diagram of detection circuit.

FIG. 12 is the block diagram of the detection circuit 17. The detection circuit 17 possesses the first to third detection units 70-1 to 70-3. The first to third detection units 70-1 to 70-3 monitor voltage VERA generated by voltage generation circuit 15 during data erasing. The first detection unit 70-1 controls SGD driver 61 and SGS driver 62 based on the level of voltage VERA. The second detection unit 70-2 controls CGDD driver 64 and CGDS driver 65 based on the level of voltage VERA. The third detection unit 70-3 controls the BG driver 63 based on the level of voltage VERA. The other structure remains the same as Embodiment 1.

[2] Erase Operation of the NAND Flash Memory 1

Next, the erase operation of the above structured NAND flash memory 1 will be explained. The erasing target block is to be BLK0, which is the selected block. Similar to the Embodiment 1, the control circuit 16 starts the erasing sequence of the selected block BLK0 upon receiving the erasing command.

Figure 13:
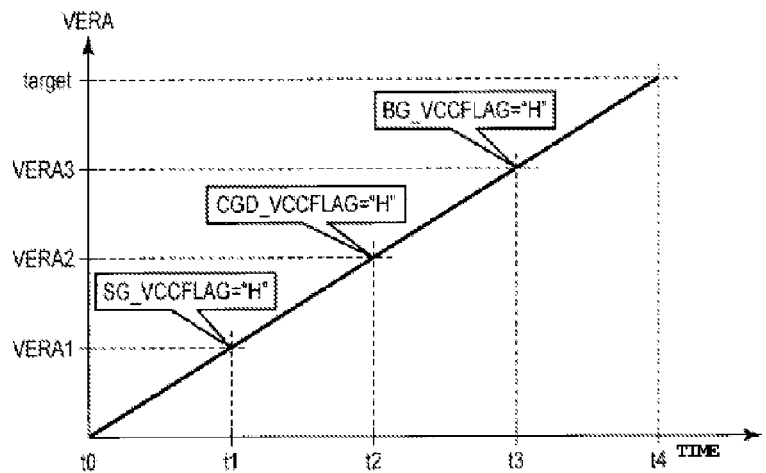
FIG. 13 is a graph showing the relationship between voltage VERA and each flag signals.

First, at time t0, the control circuit 16 issues a command to the voltage generation circuit 15 to boost the voltage VERA. BL/SL driver 14 responds to the command of the control circuit 16 and provides voltage VERA to the bit line BL and source line SL. FIG. 13 is the graph that shows the relationship between voltage VERA and each flag signals.

During this time, the block decoder 40 treats signal TG="H" level (=Vdda), signal RDECADn="L" level. SGD driver 61-0, SGS driver 62-0, CG driver 60, BG driver 63, CGDD driver 64, and CGDS driver 65 output Vss. Therefore, in row decoder 11-0, transistors 51, 53, 50, 55, 56, and 57 all become ON state. Consequently, the electrical potential of SGDI, SGSI, WL0 to WL7, BGI, WLDD, and WLDS becomes Vss.

Continually, at time t1, the level of voltage VERA reaches VERA1. Then, the first detection unit 70-1 outputs flag signal SG_VCCFLAG (="H" level). Upon receiving flag signal SG_VCCFLAG, SGD driver 61-0 and SGS driver 62-0 each transfers exterior voltage Vcc (Vcc>Vdda) to signal lines SGD0 and SGS0. From this, since Vcc>Vdda, transistors 51-0 and 53-0 in row decoder 11-0 become cut-off state, and the selecting gate lines SGDI0 and SGSI0 becomes an electrically floating state. After that, the selecting gate lines SGDI0 and SGSI0 increase with the coupling of the bit line BL and source line SL and reach the desired electrical potential.

Continually, at time t2, the level of voltage VERA reaches VERA2. Then, the second detection unit 70-2 outputs flag signal CGD_VCCFLAG (="H" level). Upon receiving flag signal CGD_VCCFLAG, CGDD driver 64 and CGDS driver 65 each transfer exterior voltage Vcc to signal lines CGDD and CGDS. From this, transistors 56 and 57 in row decoder 11-0 become cut-off state, and dummy word lines WLDD and WLDS become an electrically floating state. After that, dummy word lines WLDD and WLDS increase with the coupling of bit line BL and source line SL, and reach the desired electrical potential.

Continually, at time t3, the level of voltage VERA reaches VERA3. Then, the third detection unit 70-3 outputs flag signal BG_VCCFLAG (="H" level). Upon receiving flag signal BG_VCCFLAG, BG driver 63 transfers exterior voltage Vcc to signal line BG. From this, the transistor 55 in row decoder 11-0 becomes cut-off state, and the back gate line BGI becomes an electrically floating state. After that, the back gate line BGI increases with the coupling of the bit line BL and source line SL, and reaches the desired electrical potential.

Continually, if voltage VERA reaches voltage VERA target at time t4, row decoder 11-0 provides, for example, 0V to word lines WL0 to WL7. During this time, the selecting gate lines SGDI0 and SGSI0, dummy word lines WLDD and WLDS, and back gate lines BGI are set to the desired electrical potential due to the coupling of the bit line BL and source line SL. From this, the electrons on the charge storage layer of memory cell transistors MT0 to MT7 are pulled away towards the body side, and data is erased.

During the erase operation, SGD, SGS, CGDD, CGDS, WL, WLDD, WLDS, and BG of the unselected blocks BLK1 to BLK3 are electrically floating, and their electrical potentials are determined by the coupling with VERA.

After that, similar to the Embodiment 1, erase verification is performed; if verification does not pass, the control circuit 16 sets the step up voltage for the various voltages for erasing. Setting-operation of the step up voltage will be explained below.

Figure 14:
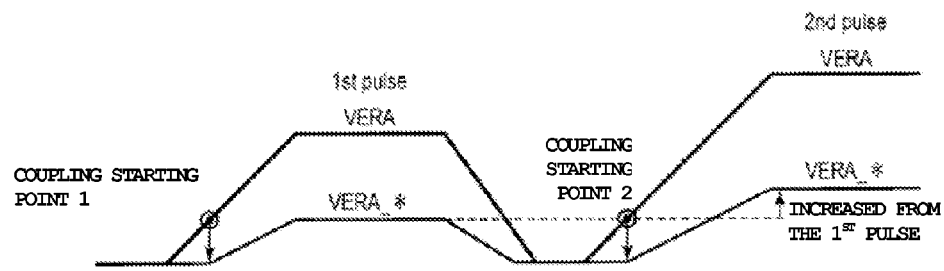
FIG. 14 is a diagram explaining the setting-operation of the step up voltage relating to the first example.

FIG. 14 is the diagram explaining the setting-operation of the step up voltage relating to the first example. As the number of erasing loop increases, the target voltage (arrival voltage) of voltage VERA steps up with a step up voltage of ΔVERA. Step up voltage of ΔVERA is fixed for each erasing loop.

Even if the number of erasing loops increases, voltage VERA_* is controlled so that when voltage VERA reaches a certain voltage, they start to increase. That is, as shown in FIG. 14, the level of voltage VERA at the coupling starting point 2 in the $2^{nd}$ erasing loop is the same as the level of voltage VERA at the coupling starting point 1 in the $1^{st}$ erasing loop. From this, as the step up voltage ΔVERA of voltage VERA increases, the step up voltage ΔVERA_* of voltage VERA_* also increases at the same rate.

The coupling starting point corresponds with the time when the corresponding signal line becomes floating. If the coupling starting point (that is, the coupling starting voltage) is the same for each erasing loop, the arrival voltage of voltage VERA_* is determined having the coupling ratio of the signal line that applies voltage VERA_* to the bit line BL (and source line SL) as its coefficient. For instance, if the step up voltage ΔVERA_* is to be the same as the step up voltage ΔVERA, the coupling starting point should be adjusted. Similarly, if the ratio of step up voltage ΔVERA to step up voltage ΔVERA_* is set in the range of greater than 0%, less than 100%, then the coupling starting point should be adjusted accordingly. During this time, the coupling starting voltage is detected by the detection circuit 17.

Voltage VERA_* explained in FIG. 14 may be optionally selected from voltages VERA_NOGIDL, VERA_GIDL, VERA_DWL, and VERA_BG and applied.

Figure 15:
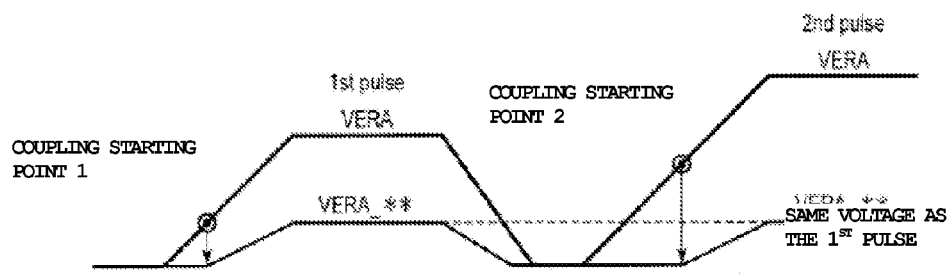
FIG. 15 is a diagram explaining the setting-operation of the step up voltage relating to the second example.

FIG. 15 is the diagram explaining the setting-operation of the step up voltage relating to the second example. As the number of erasing loop increases, the target voltage (arrival voltage) of voltage VERA steps up with a step up voltage of ΔVERA.

Even if the number of erasing loops increases, voltage VERA_ is controlled so that it does not step up. That is, as shown in FIG. 15, the value of voltage VERA at the coupling starting point 2 in the second erasing loop is set higher than the value of voltage VERA at the coupling starting point 1 in the first erasing loop. The value of voltage VERA at the coupling starting point 2 is determined according to the coupling ratio of the signal line that applies voltage VERA_ to the bit line BL (and source line SL). From this, compared to the $1^{st}$ erasing loop, since the $2^{nd}$ erasing loop will start the coupling later, even if the voltage VERA steps up in response to the number of erasing loops, the arrival voltage of voltage VERA_** may be kept fixed.

Voltage VERA_ explained in FIG. 15** may be optionally selected from voltages VERA_NOGIDL, VERA_GIDL, VERA_DWL, and VERA_BG and applied.

With the above control, the step up starting point of the various voltages for erasing (VERA_NOGIDL, VERA_GIDL, VERA_DWL, and VERA_BG) is set. Then based on the control of control circuit 16, detection circuit 17, driver circuit 12, and row decoder 11 operate to set the various stepped up voltages for erasing (VERA, VERA_NOGIDL, VERA_GIDL, VERA_DWL, and VERA_BG) to the various signal lines. After that, similar to the Embodiment 1, erasing loop is repeated until it passes the erase verification.

[3] Effects

As detailed above, in the Embodiment 2, other than voltage VERA that is to be provided to the bit line BL and/or source line SL are set by capacitive coupling of the bit line BL and/or source line SL. In addition, based on the detection result of the detection circuit 17, the row decoder 11 controls the timing of when the selecting gate line SGDI, selecting gate line SGSI, dummy word line WLDD (and WLDS), and back gate line BGI each become a floating state, in order to individually adjust the step up voltages of voltage VERA_GIDL, VERA_NOGIDL, VERA_DWL, and VERA_BG.

Therefore, according to the Embodiment 2, even if the types of voltages to be used for data erasing increase, the step up amount of the various voltages may be ideally controlled. From this, a stable erase operation may be performed.

In addition, the boost voltage is not only for voltage VERA that is to be provided to the source line SL and bit line BL, but the electrical potential of other nodes are also increased by coupling. From this, the power consumption can be reduced.

In the above embodiments, a three-dimensionally laminated NAND flash memory is used as an example for the non-volatile semiconductor device to be explained. However, as for the three-dimensionally laminated NAND flash memory, the structure is not limited to those in FIGS. 3 to 5. For instance, the semiconductor layer 26 may not be in a U-shaped form, it could be in a single columnar form. In this case, transistor BT is unnecessary.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor device comprising:
   a plurality of memory cells stacked above a substrate, and connected in series between a first selecting transistor and a second selecting transistor;
   a plurality of word lines connected to control gates of the plurality of memory cells;
   a first selecting gate line connected to a gate of the first selecting transistor and a second selecting gate line connected to a gate of the second selecting transistor;
   a bit line connected to the first selecting transistor;
   a source line connected to the second selecting transistor; and
   a control circuit configured to execute an erasing loop including a plurality of erase operations, the plurality of erase operations including a first erase operation and a second erase operation, the control circuit being configured to apply a first voltage to one of the bit line and the source line and to apply a second voltage to one of the first selecting gate line and the second selecting gate line during the first erase operation, the control circuit being configured to apply a third voltage to one of the bit line and the source line and to apply a fourth voltage to one of the first selecting gate line and the second selecting gate line during the second erase operation, the third voltage being higher than the first voltage, the fourth voltage being substantially the same as the second voltage.

2. The non-volatile semiconductor device of claim 1, wherein when the second voltage is applied to the first selecting gate line, the control circuit adjusts the second voltage provided to the first selecting gate line and a fifth voltage provided to the second selecting gate line.

3. The non-volatile semiconductor device of claim 2, further comprising a detection circuit, wherein the control circuit is configured to adjust the second voltage and the fifth voltage based on a detection result of the detection circuit.

4. The non-volatile semiconductor device of claim 2, further comprising:
   a first dummy word line and a second dummy word line.

5. The non-volatile semiconductor device of claim 4, wherein a sixth voltage is provided to one of the first and second dummy word lines.

6. The non-volatile semiconductor device of claim 5, wherein the sixth voltage is lower than the second voltage.

7. The non-volatile semiconductor device of claim 5, wherein the first voltage is substantially equal to an erasing voltage.

8. The non-volatile semiconductor device of claim 7, wherein
   when a voltage applied to one of the bit line and the source line reaches a seventh voltage before reaching the first voltage, the control circuit is configured to start making one of the first selecting gate line and the second selecting gate line floating, and
   when a voltage applied to one of the bit line and the source line reaches an eighth voltage before reaching the third voltage, the control circuit is configured to start making one of the first selecting gate line and the second selecting gate line floating.

9. The non-volatile semiconductor device of claim 8, wherein the seventh voltage is different from the eighth voltage.

10. The non-volatile semiconductor device of claim 9, wherein the control circuit is configured to apply a first voltage to both the bit line and the source line.

11. The non-volatile semiconductor device of claim 1, wherein the control circuit is configured to apply a first voltage to both the bit line and the source line.

12. The non-volatile semiconductor device of claim 1, wherein
   when a voltage applied to one of the bit line and the source line reaches a seventh voltage before reaching the first voltage, the control circuit is configured to start making one of the first selecting gate line and the second selecting gate line floating, and
   when a voltage applied to one of the bit line and the source line reaches an eighth voltage before reaching the third voltage, the control circuit is configured to start making one of the first selecting gate line and the second selecting gate line floating.

13. The non-volatile semiconductor device of claim 12, wherein the seventh voltage is different from the eighth voltage.

14. The non-volatile semiconductor device of claim 13, wherein the control circuit is configured to apply a first voltage to both the bit line and the source line.

* * * * *